United States Patent
Nishijima et al.

(10) Patent No.: US 11,335,615 B2
(45) Date of Patent: May 17, 2022

(54) WAFER ACCOMMODATION CONTAINER

(71) Applicant: Achilles Corporation, Tokyo (JP)

(72) Inventors: Masayuki Nishijima, Tokyo (JP); Kenichi Hirose, Tokyo (JP)

(73) Assignee: ACHILLES CORPORATION, Tokyo (JP)

( * ) Notice: Subject to any disclaimer, the term of this patent is extended or adjusted under 35 U.S.C. 154(b) by 36 days.

(21) Appl. No.: 16/498,262

(22) PCT Filed: Mar. 19, 2018

(86) PCT No.: PCT/JP2018/010906
§ 371 (c)(1),
(2) Date: Sep. 26, 2019

(87) PCT Pub. No.: WO2018/180733
PCT Pub. Date: Oct. 4, 2018

(65) Prior Publication Data
US 2020/0105632 A1    Apr. 2, 2020

(30) Foreign Application Priority Data

Mar. 31, 2017  (JP) .............. JP2017-069918

(51) Int. Cl.
*H01L 23/13*    (2006.01)
*H01L 23/051*   (2006.01)

(52) U.S. Cl.
CPC ............ *H01L 23/13* (2013.01); *H01L 23/051* (2013.01)

(58) Field of Classification Search
CPC .............................. H01L 23/13; H01L 23/051

USPC .......................................................... 257/678
See application file for complete search history.

(56) References Cited

U.S. PATENT DOCUMENTS

| 2004/0045263 | A1 | 3/2004 | Haggard et al. |
| 2004/0256285 | A1 | 12/2004 | Forsyth |
| 2009/0095650 | A1* | 4/2009 | Pylant ............... H01L 21/67379 206/710 |

FOREIGN PATENT DOCUMENTS

| JP | 2004262545 A | 9/2004 |
| JP | 2006527921 A | 12/2006 |
| JP | 2011500462 A | 1/2011 |
| JP | 2017037893 A | 2/2017 |
| WO | 2005/001890 A2 | 1/2005 |
| WO | 2009/048456 A1 | 4/2009 |
| WO | 2018/180733 A1 | 10/2018 |

OTHER PUBLICATIONS

International Search Report and Written Opinion dated Jun. 26, 2018 for International Patent Application Serial No. PCT/JP2018/010906 (Original and English translation provided).

* cited by examiner

*Primary Examiner* — Xia L Cross
(74) *Attorney, Agent, or Firm* — K&L Gates LLP; Louis C. Cullman; Giorgios N. Kefallinos

(57) ABSTRACT

Described herein are wafer accommodation containers. A wafer accommodation container (1) includes: a container body having one end that is provided with an opening (11) and another end that is provided with a mount element (12) on which wafers are stacked, the mount element (12) facing the opening (11); a cover (20) to cover the opening (11); and a connection mechanism (30) to detachably connect the container body (10) and the cover (20).

7 Claims, 8 Drawing Sheets

WAFER ACCOMMODATION CONTAINER

CROSS REFERENCE TO RELATED APPLICATION(S)

This application is a national phase filing of PCT/JP2018/010906, filed on Mar. 19, 2018, which claims priority to Japanese Patent Application No. 2017-069918, filed on Mar. 31, 2017, the entire disclosures of which are incorporated herein by reference.

TECHNICAL FIELD

The present disclosure relates to a wafer accommodation container.

BACKGROUND ART

Wafer accommodation containers for accommodating a semiconductor wafer include a container that is disclosed, for example, in Patent Literature 1.

A wafer accommodation container disclosed in Patent Literature 1 includes a housing member having an approximately tubular body side wall portion and disposed on a body of the container. Cushioning elements or the like are disposed on the top and the bottom of the housing member. Wafers and spacer sheets (such as synthetic resin sheets, clean papers, or molded articles made of synthetic resin) are arranged alternately between the top-side cushioning element and the bottom-side cushioning element to be accommodated in the housing member. A cover having an approximately tubular cover side wall portion is placed over the housing member and is held by a connection mechanism, thereby sealing the housing member.

CITATION LIST

Patent Literature

Patent Literature 1: Unexamined Japanese Patent Application Kokai Publication No. 2004-262545

SUMMARY OF INVENTION

Technical Problem

In the wafer accommodation container disclosed in Patent Literature 1, the body side wall portion of the housing member to accommodate the wafers is configured to fit the outer diameters of the wafers, and the cover side wall portion is placed over the exterior of the body side wall portion, thereby sealing the housing member. Accordingly, in a case in which the cover is automatically placed over the housing member using a device such as a robot, little trouble arises. However, in a case in which a user manually places the cover over the housing member, there is a fear that the accommodated wafers might be damaged by the cover side wall portion if the user fails to align the central axis of the container body with the central axis of the cover and thus fails to concentrically place the cover with the housing member. Particularly, in a case in which the wafer accommodation container has a structure in which the body side wall portion of the housing member is configured to be larger than the outer diameters of the wafers and the cover side wall portion is disposed inside to hold the wafers, such a structure is much more likely to arise the problem that the wafers are damaged by the cover side wall portion.

The present disclosure is developed in consideration of the aforementioned circumstances, and an objective of the present disclosure is to provide a wafer accommodation container enabling a cover to be placed over a container body without damaging wafers accommodated in the container body.

Solution to Problem

In order to attain the aforementioned objective, a wafer accommodation container according to the present disclosure includes: a container body having one end that is provided with an opening and another end that is provided with a mount element on which wafers are stacked, the mount element facing the opening; a cover to cover the opening; and a connection mechanism to detachably connect the container body and the cover, wherein the connection mechanism includes (i) at least two engagement members each extending from the other end of the container body to the one end of the container body and each having one end that is provided with an engagement nail and (ii) at least two engagement holes included in the cover and configured to be each fitted to the corresponding engagement nail, and the cover includes guide members each disposed on corresponding one of cover side wall portions of the cover and configured to guide the cover while the guide members are coming into contact with the corresponding engagement members with the container body kept concentric with the cover when the cover is attached to the container body.

The mount element of the container body preferably includes body side wall portions that define an accommodation space for accommodating the wafers and that are placed at intervals, and the engagement members preferably are higher than the body side wall portions.

The guide members are preferably formed as a rib placed on an exterior of the corresponding one of the cover side wall portions.

The cover preferably includes a cover upper surface portion to cover the opening and the cover upper surface portion preferably includes at least two holding members configured to swing in a central direction of the cover upper side portion and to press exteriors of the stacked wafers accommodated in the container body, the holding members preferably each includes a surface pressing member to press outer circumferential surfaces of the wafers, the container body preferably has guide grooves to make tips of the holding members move from an outer side of the mount element to an inner sides of the mount element to guide the tips of the holding members to positions at which the holding members press the outer circumferential surfaces of the wafers, and the guide grooves are preferably formed as a dent on a surface of the mount element.

Advantageous Effects of Invention

According to the present disclosure, the cover can be placed over the container body without damaging the wafers accommodated in the container body.

DESCRIPTION OF EMBODIMENTS

Figure 1:
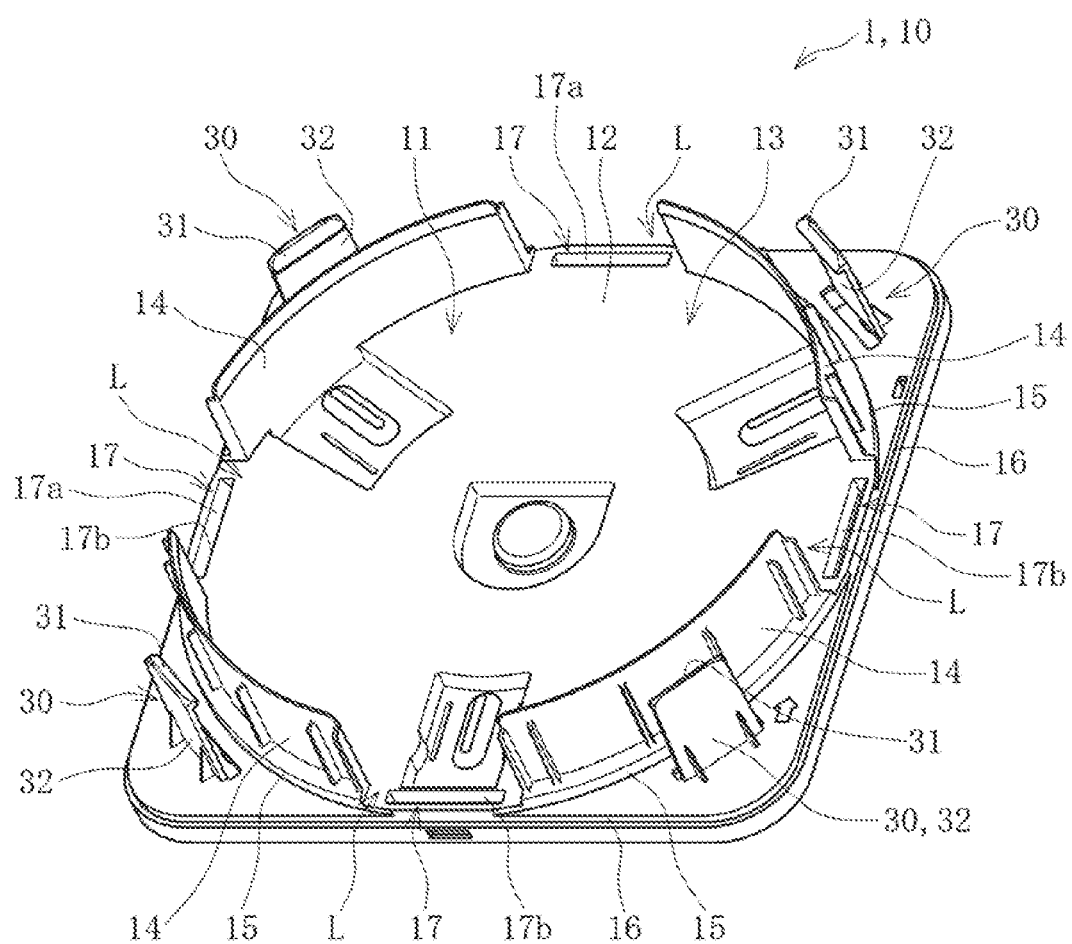
FIG. 1 is a schematic and perspective view illustrating a container body of an embodiment of a wafer accommodation container of the present disclosure.

An embodiment of the wafer accommodation container of the present disclosure is described below in detail with reference to the drawings.

A wafer accommodation container 1 according to the present disclosure includes: a container body 10 having one end that is provided with an opening 11 and another end that is provided with a mount element 12 that faces the opening 11 and on which wafers W are stacked; a cover 20 to cover the opening 11, and a connection mechanism 30 to detachably connect the container body 10 and the cover 20. The connection mechanism 30 includes (i) at least two engagement members 32 each extending from the other end of the container body 10 to the one end of the container body 10 and each having one end that is provided with an engagement nail 31 and (ii) at least two engagement holes 33 included in the cover 20 and configured to be each fitted to the corresponding engagement nail 31. Also, the cover 20 includes guide members 40 each disposed on corresponding one of cover side wall portions 21 and configured to guide the cover 20 while the guide members 40 are coming into contact with the corresponding engagement members 32 with the container body 10 kept concentric with the cover 20 when the cover 20 is attached to the container body 10.

As a result, when the cover 20 is placed over the container body 10, guide members 40 of the cover side wall portions 21 come into contact with the corresponding engagement members 32 of the container body 10 in at least two portions of the cover. The cover 20 is guided while the guides 40 are coming into contact with the corresponding engagement members 32 with the container body 10 kept concentric with the cover 20, thereby enabling the cover 20 to be placed over the container body 10 without damaging the accommodated wafers W by the cover side wall portions 21.

In the present embodiment described below, the opening 11 of the container body 10 opens upward and the horizontal wafers W are stacked on the mount element 12. After placing the wafers W in the wafer accommodation container 1 in a stack and then covering the wafer accommodation container 1 with the cover 20, the wafer accommodation container 1 can be transported while being in any position. Even though flat surfaces of the wafers W is perpendicular to, for example, the horizontal direction or the vertical direction, such positions of the wafers do not cause any problems.

The container body 10 includes the mount element 12 serving as a bottom plate. As illustrated in FIG. 1A, the mount element 12 is shaped like an approximately square-shaped rectangle that has four arc-shaped corners. The wafers W are stacked on the upper surface of the mount element 12 to be accommodated in the container body. The shape of the mount element 12 is not limited to the rectangle, and the mount element 12 may have another shape.

The mount element 12 includes body side wall portions 14 defining an accommodation space 13 for accommodating the wafers W and the body side wall portions 14 protrude upward. The body side wall portions 14 each have a circular-arc shape to form portions of a cylindrical tube in accordance with the shapes of the wafers W, and the number of the body side wall portions 14 is, for example, four. The body side wall portions 14 are arranged on the circumference of a circle and at intervals L. The body side wall portions 14 are formed integrally with the mount element 12. As a result, the upper edges of the body side wall portions 14 form the opening 11 of the container body 10, and the space defined by the body side wall portions 14 serves as the accommodation space 13 for accommodating the wafers W.

The cylindrical tube partially formed by the body side wall portions 14 has such an inner diameter as does not pose an obstacle to the placement of the wafers W in the accommodation space 13 and the removal of the wafers W from the accommodation space 13. The cylindrical tube partially formed by the body side wall portions 14 has an inner diameter larger than the sizes (diameters) of the wafers W (for example, an inner diameter larger than the diameters of the wafers W by 1 to 2 mm), for example, an inner diameter of 5 inch, 6 inch, 8 inch or 12 inch. Interval spaces L between the body side wall portions 14 serve as an insertion slot through which a robot arm for grasping the wafers W is inserted in the accommodation space 13.

Figure 2A:
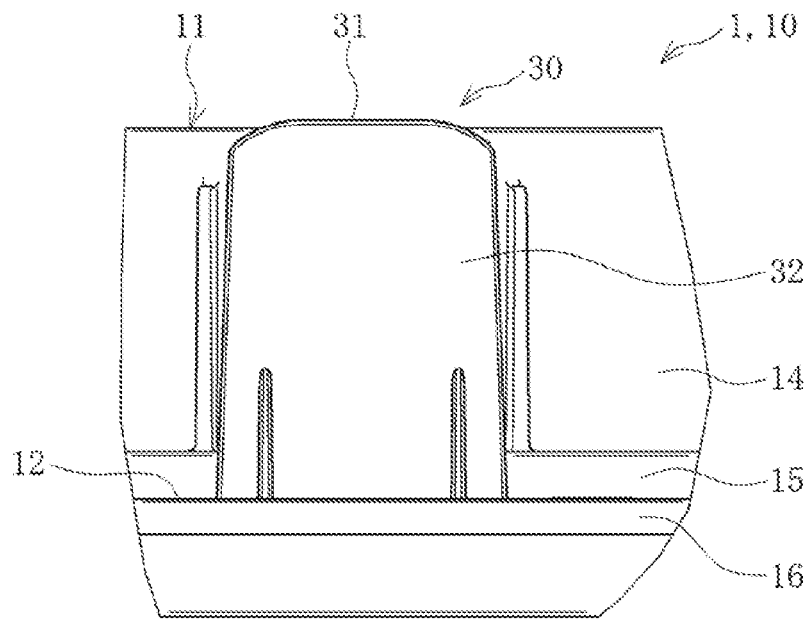
FIG. 2A is a rear view illustrating an engagement member of the embodiment of the wafer accommodation container of the present disclosure.
Figure 2B:
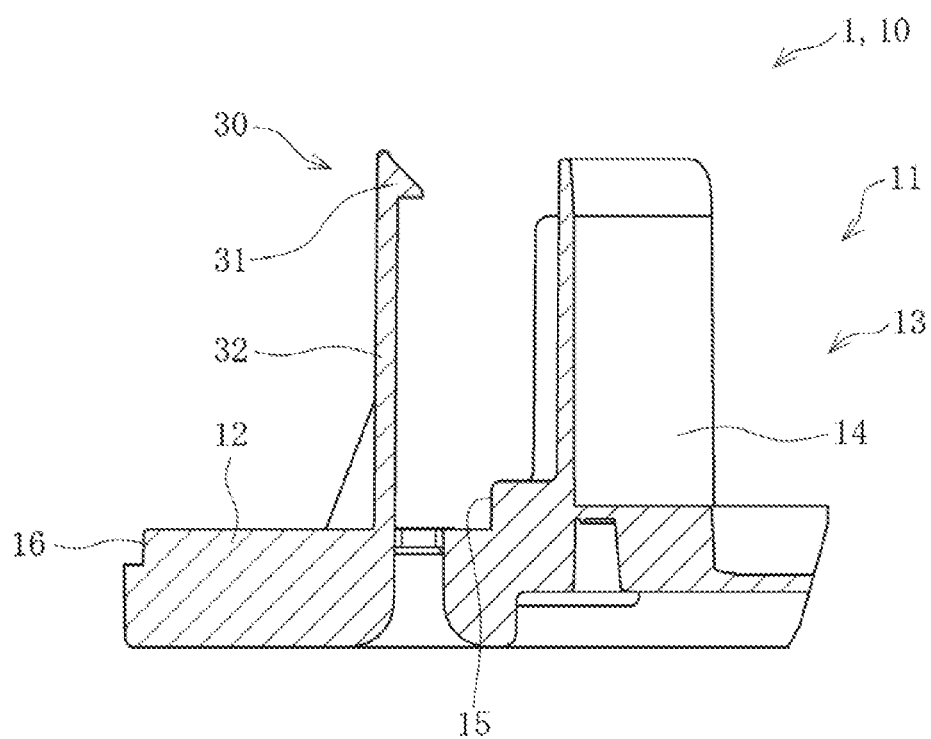
FIG. 2B is a cross sectional view illustrating the engagement member of the embodiment of the wafer accommodation container of the present disclosure.
Figure 3:
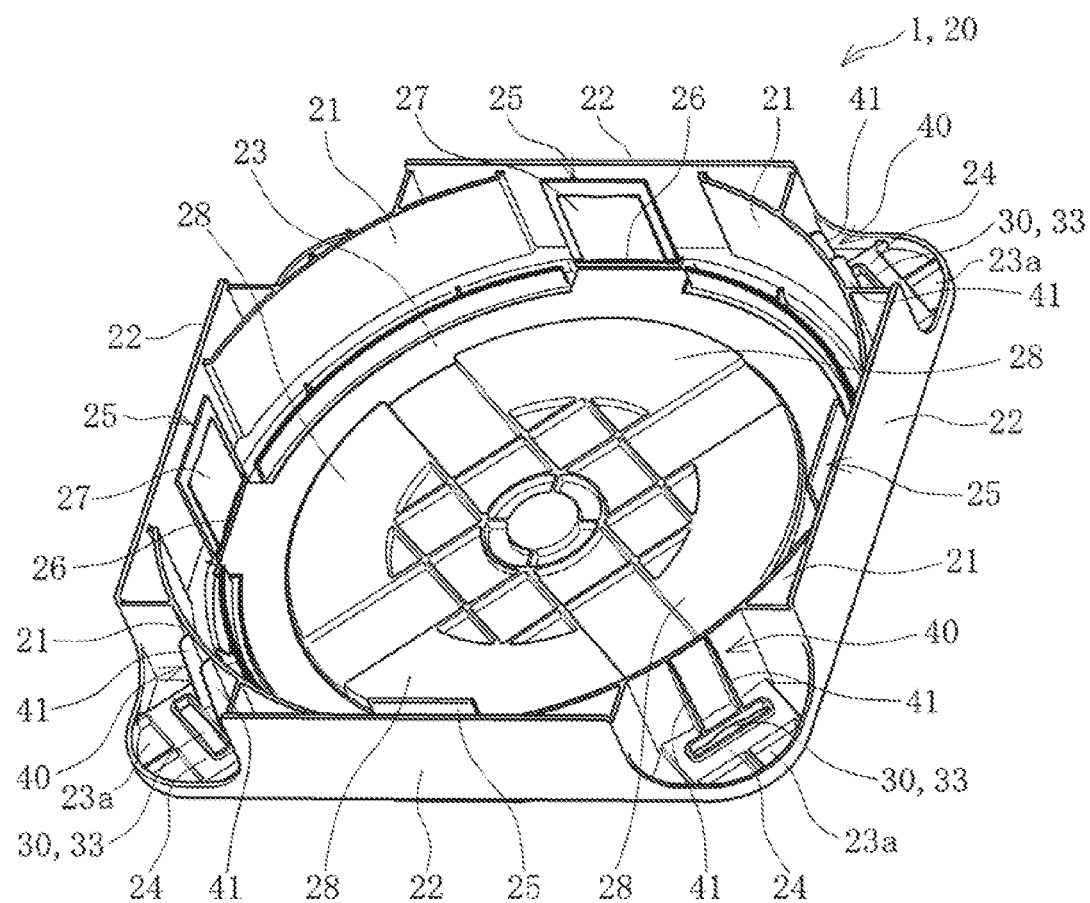
FIG. 3 is a schematic and perspective view illustrating a state in which a cover of the embodiment of the wafer accommodation container of the present disclosure is turned over.

As illustrated in FIGS. 1, 2A and 2B, the container body 10 has arc-shaped sealing surfaces 15 for the cover 20 (illustrated in FIG. 3) that are located on the outer circumferences of the lower ends of the body side wall portions 14, and the arc-shaped sealing surfaces 15 protrude upward. Linear sealing surfaces 16 are formed in the interval spaces L between the body side wall portions 14 on the circumference of the mount element 12 by making a difference in level. Both ends of the linear sealing surfaces 16 connect to the corresponding arc-shaped sealing surfaces 15 to form a ring shape, and the linear sealing surfaces 16 surround the entire circumference of the container body 10.

As a result, when the container body 10 is covered with the cover 20 described below, the inner surfaces of the four cover side wall portions 21 of the cover 20 come into contact with the corresponding arc-shaped sealing surfaces 15. Additionally, the linear sealing surfaces 16 come into contact with corresponding ones of straight line-shaped cover outer wall portions 22 that are formed on the four edges and that connect to the cover side wall portions 21 of the cover 20. As a result of the contact between the inner surfaces of the cover side wall portions 21 and the sealing surfaces 15 and the contact between the sealing surfaces 16 and the cover outer wall portions 22, the wafer accommodation container 1 is sealed, thereby enabling the container body 13 to be sealed.

As illustrated in FIGS. 3, 4 5A, 5B and 8, the cover 20 is placed over the container body 10 to close the opening 11 (refer to FIG. 1). The cover 20 includes a cover upper surface portion 23 having the approximately same outer shape as that of the mount element 12 and the outer shape is an approximately square-shaped rectangle that has four arc-shaped corners. As illustrated in these drawings, cover upper surface portions 23a are outer circumferential edge portions of the cover upper surface portion 23 that are lower than the annular central portion of the cover upper surface portion 23.

The cover upper surface portion 23 includes four cover side wall portions 21 corresponding to the body side wall portions 14 of the container body 10 and the cover side wall portions 21 are disposed on the four corner of the cover upper surface portion 23 and protrude downward. Additionally, the cover surface portion 23 includes cover outer wall portions that are disposed on corresponding ones of the four linear edges of the cover upper surface portion 23, and the cover outer wall portions 22 protrude downward. The both ends of each of the cover outer wall portions 22 connect with the corresponding one of the cover side wall portions 21, thereby surrounding the entire circumference of the cover 20.

As a result, when the cover 20 is placed over the container body 10, as described above, the wafer accommodation container 1 is sealed by the contact between the inner surfaces of the cover side wall portions 21 and the sealing surfaces 15 and the contact between the sealing surfaces 16 and the cover outer wall portions 22, thereby enabling the container body 13 to be sealed.

The wafer accommodation container 1 includes the connection mechanism 30 to detachably connect the container body 10 and the cover 20. The connection mechanism 30 includes (i) at least two engagement members 32 each extending from the other end of the container body 10 to the one end of the container body 10 and each having one end that is provided with an engagement nail 31 and (ii) at least two engagement holes 33 included in the cover 20 and configured to be each fitted to the corresponding engagement nail 31.

As illustrated in FIGS. 1, 2A and 2B, the container body 10 includes the four engagement members 32 disposed on the portions of the four corresponding corners of the mount element 12 and outside the corresponding body side wall portions 14. The engagement members 32 are formed integrally with the mount element 12 and protrude upward (toward the opening 11 with which the one end of the container body is provided). The engagement nail 3 is disposed on the inner-side portion of the tip of each of the engagement members 32. The engagement nails 31 of the engagement members 32 are fitted into the corresponding engagement holes 33 of the cover 20, thereby enabling the container body 10 to be kept connected with the cover 20. As illustrated in FIGS. 2A and 2B, the tips of the engagement nails 31 are located slightly higher than the upper edges of the body side wall portions 14.

The cover 20 has the engagement holes 33 that are formed on the corresponding cover upper surface portions 23a that correspond to the engagement members 32 of the container body 10. After the engagement nails 31 of the engagement members 32 of the container body 10 pass through the corresponding engagement holes 33, the lower edges horizontal faces of the engagement nails 31 gets caught on the cover 20, thereby keeping the container body 10 connected with the cover 20.

Figure 5A:
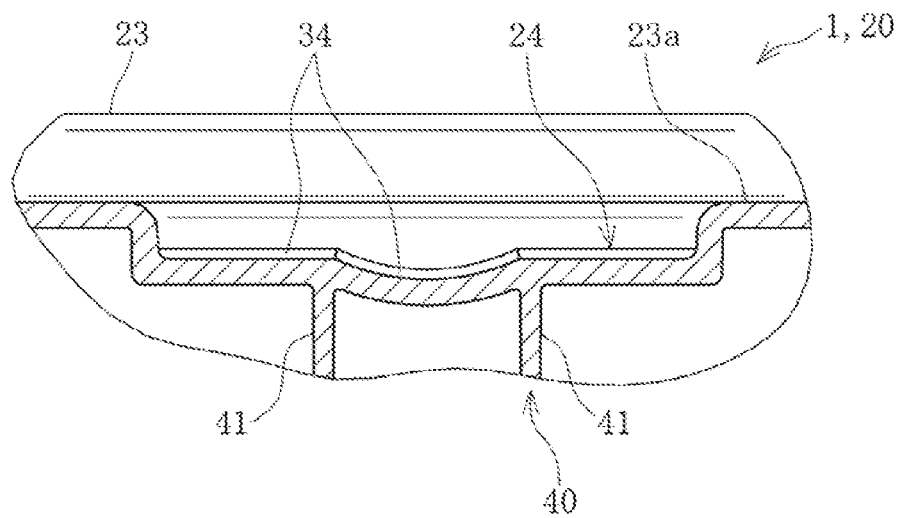
FIG. 5A is a cross sectional view illustrating an engagement hole of the cover of the embodiment of the wafer accommodation container of the present disclosure and FIG. 5B is a cross sectional view of a central portion having the engagement hole of the embodiment of the wafer accommodation container of the present disclosure.
Figure 5B:
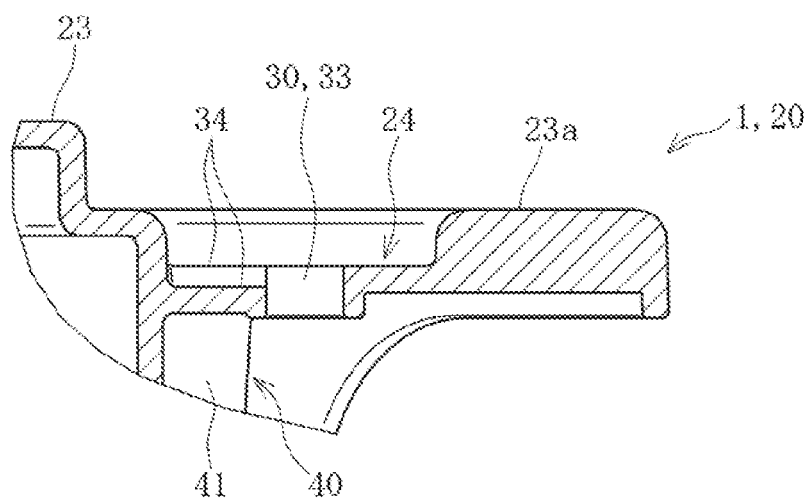
Figure 6A:
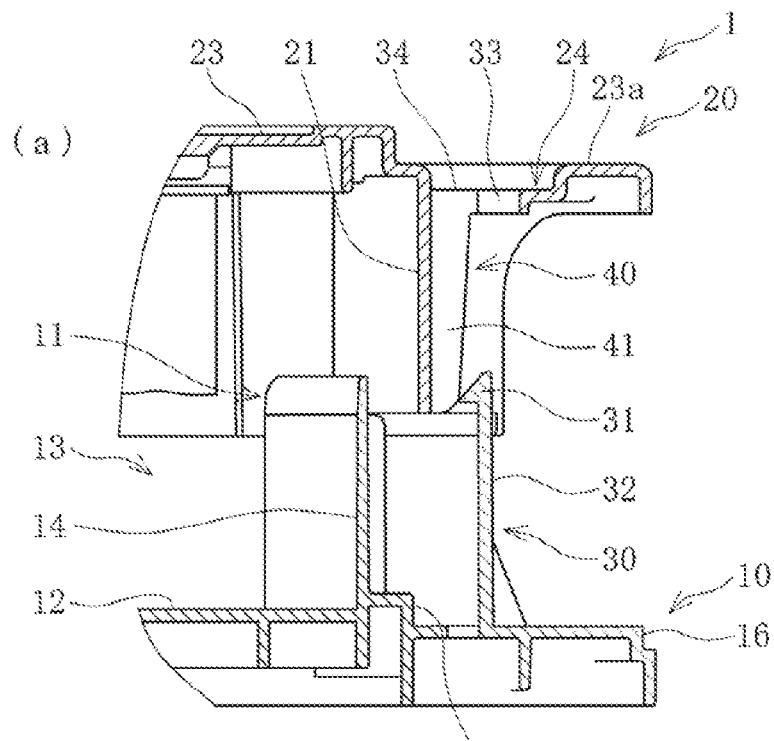
FIG. 6A is an explanatory view illustrating a state in which a guidance process by a guide member starts in the embodiment of the wafer accommodation container of the present disclosure and FIG. 6B is an explanatory view illustrating a state in which the guidance process by the guide member is completed in the embodiment of the wafer accommodation container of the present disclosure.
Figure 6B:
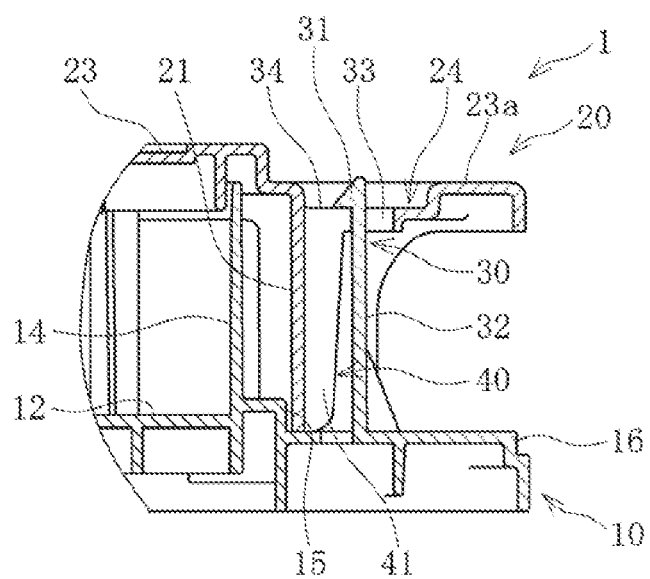

As illustrated in FIG. 5B, the engagement holes 33 are formed in corresponding concave portions 24 included in the cover upper surface portions 23a. The concave portions 24 each have a depth to such an extent that the engagement nails 31 of the engagement members 32 do not protrude from the surface of the cover 20 or a depth to such an extent that the engagement nails 31 of the engagement members 32 slightly protrude from the surface of the cover 20 as illustrated in FIG. 6B. As illustrated in FIG. 5A, engagement faces 34 for the engagement holes 33 are formed to be faces enabling the engagement nails 31 to be easily pushed back when the cover 20 is bent inward to remove the cover from the container body.

When the cover 20 is placed over the container body 10, the four engagement nails 31 of the engagement members 32 of the cover 10 pass through the corresponding engagement holes 33 of the cover 20. After passing through the engagement holes 33, the engagement nails 31 get caught on the corresponding engagement faces 34. In this state in which the engagement nails 31 get caught on the corresponding engagement faces 34, the container body 10 and the cover 20 are connected with each other while the accommodation space 13 for the wafers W is sealed. Additionally, when the engagement nails 31 are released from the engagement faces 34, the engagement members 32 can be infallibly and easily pushed back from the central side toward the outer side using dents of the central portions of the engagement faces 34 of the cover 20. The connection mechanism 30 should be configured to enable the container body 10 to be kept connected with the cover 20. The connection mechanism 30 should be disposed on each of at least two portions of the container body 10, for example, on at least two portions of the container body 10 that are located on a diagonal line.

The cover 20 includes holding members 25 to press the exterior surfaces of the wafers W to hold the wafers W. At least two holding members 25 are disposed on positions corresponding to two portions of the exterior surfaces of the wafers W. For example, at least four holding members 25 are disposed in interval spaces L between the body side wall portions 14 of the container body 10.

The holding members 25 are formed integrally with the cover 20 to be each shaped like a flat plate. The holding members 25 protrude downward from the inner region of the cover upper surface portion 23 serving as a top board (toward the opposite side to the opening 11) and are perpendicular to the central direction of the cover side wall portions 21. The holding members 25 are formed to swing about corresponding swinging axis portions 26 of the bases of the holding members 25. Since the holding members 25 are formed integrally with the cover 20, the swinging axis portions 26 each serve as a hinge.

A groove is formed on the inner portion of each of the swinging axis portions 26. As a result, the portions serving as a hinge become thin due to the formation of the groove. Accordingly, the holding members 25 can easily swing about the swinging axis portions 26. Positions of the swinging axis portions 26 are determined such that the inner-side surfaces of the holding members 25 (the surfaces that face the central side of the wafers W) are located at positions at which the inner-side surfaces of the holding members 25 fit the outer diameters of the stacked wafers W that are accommodated in the container body 1.

Figure 7A:
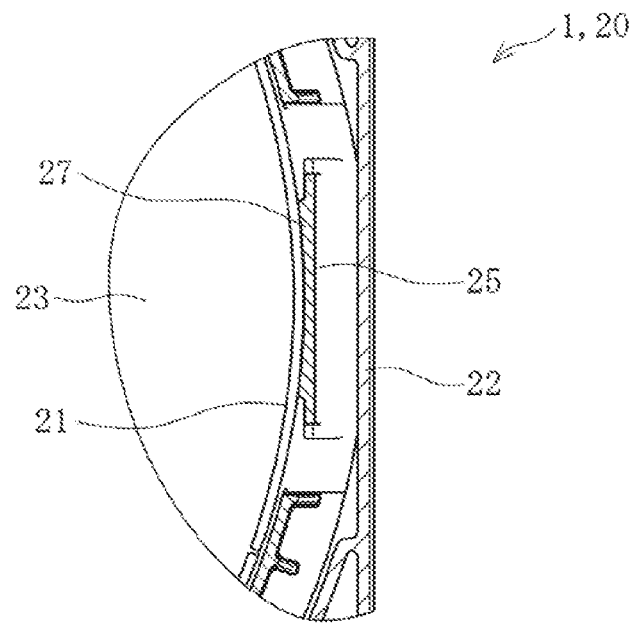
FIG. 7A is a cross sectional view illustrating a holding member of the cover of the embodiment of the wafer accommodation container of the present disclosure and FIG. 7B is a partial cross sectional view related to movement of the holding member of the embodiment of the wafer accommodation container of the present disclosure.
Figure 7B:
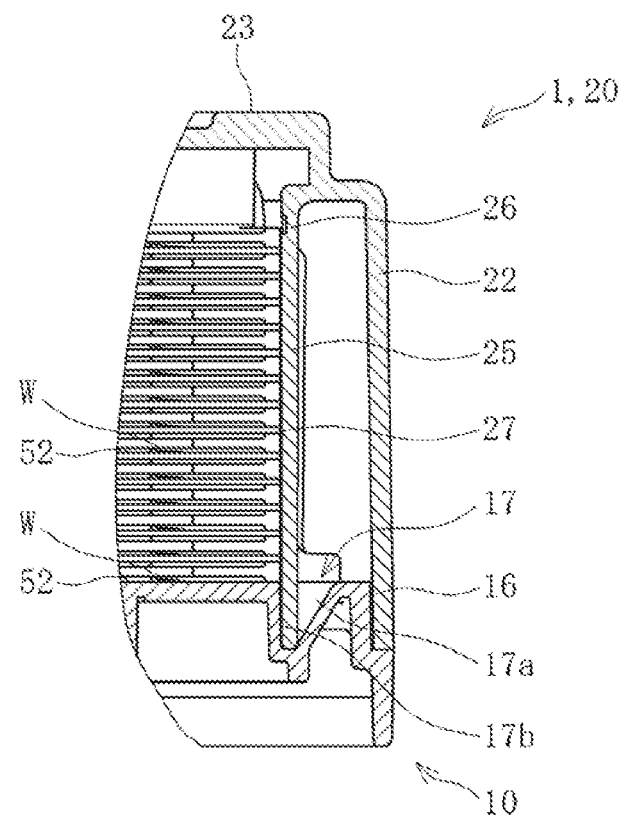

As illustrated in FIGS. 7A and 7B, a pressing surface member 27 is disposed on the inner surface of each of the holding members 25 and presses the outer circumferential surfaces of the wafers W with surface-to-surface contact. For example, the pressing surface members 27 are formed integrally with the corresponding holding members 25. Alternatively, the pressing surface members 27 may be formed to be separate elements from the holding members 25 or may be made of material different from material of the holding member s 25 and be attached to the holding members 25. That is, the pressing surface members 27 should be configured to infallibly press the outer circumferential surfaces of the wafers W.

As illustrated in FIGS. 1 and 7B, guide grooves 17 are formed at positions at which the holding members 25 hold the outer circumferential portions of the wafers W. The guide grooves 17 are formed on the four portions corresponding to the interval spaces L between the body side wall portions 14 of the mount element 12. The guide grooves 17 make the holding members 25 of the cover 20 swing about the swinging axis portions 26 to guide the tips of the holding members 25 from the outer side of the mount element 12 to the inner side of the mount element 12 (the central side).

The guide grooves 17 are shaped like a straight line and are perpendicular to the central direction of the mount element 12 that serves as a bottom plate. The guide grooves 17 are formed by making dents on the surfaces of the mount element 12. The guide grooves 17 each have a slope portion 17a and a vertical portion 17b, and the slope portion 17a slopes up from the central side of the container body 10 toward the outer side of the container body 10 and the vertical portion 17b connects to a central-side portion of the slope portion 17a. The slope portion 17a and the vertical portion 17b are combined with each other to form an approximately V-shaped cross section.

Regarding the container body 10, as illustrated in FIGS. 1, 2A and 2B, the mount element 12, the body side wall portions 14 and the like may each have an uneven portion, a rib, and the like for reinforcement of these elements or handling in another process if necessary.

The holding members 25 are guided by the corresponding grooves 17. The tips (the lower ends illustrated in the drawing) of the holding members 25 are located in the guide grooves 17 of the container body 10 at the initial stage of the process of the placement of the cover 20 over the container body 10 (refer to FIG. 6A). The tips of the holding members 25 are guided by the guide grooves 17 until the process of the placement of the cover 20 over the container body 10 is completed. The tips of the holding members 25 are guided until the inner-side surfaces of the holding members 25 come into contact with the vertical portions 17b of the guide grooves 17 at the completion stage where the container body 10 is completely covered with the cover 20 (refer to FIG. 6B). The protrusion lengths of the holding member 25 are determined such that the protrusion lengths of the holding member 25 are suitable for the process of guiding the holding members 25 by the guide grooves 17.

That is, in the state in which the container body 10 is covered with the cover 20, the tips of the holding members 25 are located at bottom portions of the guide grooves 17 and thus cannot return to the outer side due to the slope portion 17a. As a result, in the state in which the container body 10 is connected with cover 20, the four holding members 25 are kept at positions at which the four holding members 25 fit the outer diameters of the wafers W. Accordingly, the pressing surface members 27 of the four holding members 25 can press the outer circumferential surfaces of the stacked wafers W, thereby securely preventing horizontal movements of the wafers W.

The holding members 25 are located between (i) the cover upper surface portion 23 serving as a top board of the cover 20 and (ii) the guide grooves 17 formed by making dents on the mount element 12 serving as a bottom plate of the container body 10. As a result, the outer circumferential surfaces of all of the wafers W stacked on the substrate mounting portions 12 can be pressed with surface-to-surface contact, and even a substrate W located at the lowest position can be securely held.

Also, the container body 10 from which the cover 20 is removed does not include the holding members 25. Accordingly, the wafers W can be accommodated in the container body 10 in the same manner as before and without disturbance by the holding members 25.

As illustrated in FIGS. 3, 4, 5A and 5B, in the cover 20, the cover side wall portions 21, the cover outer wall portions 22, the cover upper surface portions 23 and the like are each provided with an uneven portion, a rib, and the like for reinforcement of these elements or handling in another process if necessary. Also, upper pressing portions 28 for vertically pressing the wafers W stacked on the mount element 12 of the container body 10 are formed integrally with the cover upper surface portion 23. As a result, the stacked wafers W are vertically pressed between the upper pressing portions 28 and the mount element 12 in the same manner as before.

For the purpose of preventing damage to the wafers W accommodated in the accommodation space 13 when the cover 20 is placed over the container body 10, the wafer accommodation container 1 is provided with at least two guide members 40. The guide members 40 are used for guiding the cover 20 while keeping the cover 20 in the concentric state in which the central axis of the cover 20 matches the central axis of the container body 10. In the example illustrated in the drawings, the four guide members 40 are disposed on the corresponding cover side wall portions 21 located on the corresponding four corners of the cover 20. The guide members 40 guide the cover 20 while coming into contact with the four corresponding engagement members 32 of the container body 10 and keeping the container body 10 concentric with the cover 20.

Figure 4:
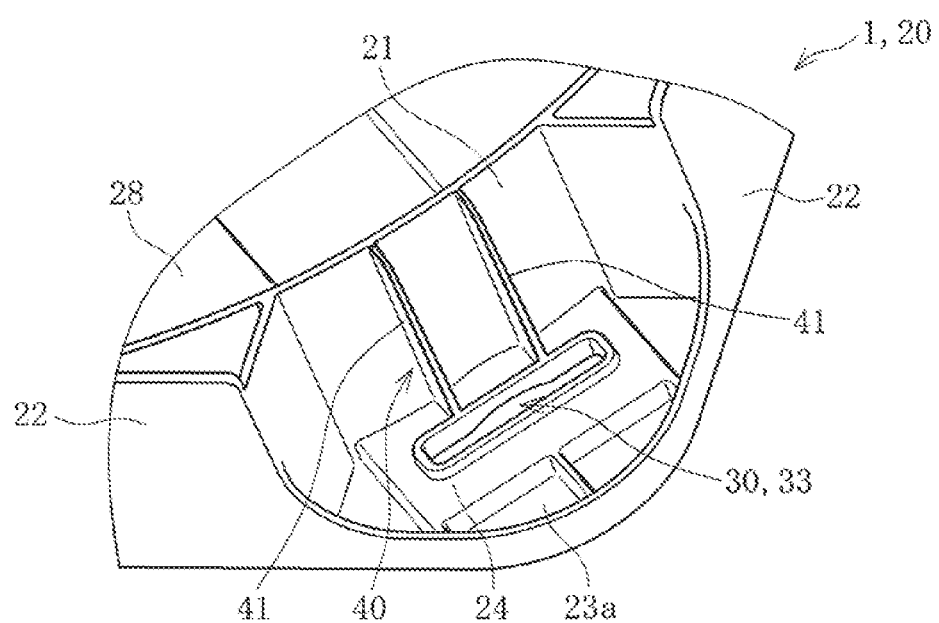
FIG. 4 is a partially enlarged view of FIG. 3 illustrating the cover of the embodiment of the wafer accommodation container of the present disclosure.

Each of the guide members 40 is provided with two rib 41 and the two ribs 41 are disposed outside corresponding one of the cover side wall portions 21. As illustrated in FIGS. 4 and 6A, the two ribs 41 are formed to be located more inward than corresponding one of the engagement members 32. Also, the two ribs 41 are formed to fit the width of the corresponding one of the engagement members 32 (that is, the length of the engagement member 32 in a direction perpendicular to the central direction), to be disposed at a distance from each other, and to protrude outward in the central direction.

Each of the ribs 41 has a tapered slope surface having an arc-shaped tip portion (in FIG. 6A, the arc-shaped tip portion corresponds to the lower end of the rib 41). The slope surface of each rib 41 is sloped in the same direction as a slope surface of the upper end of corresponding one of the engagement nails 31 of the engagement members 32. Also, the slope surface of each rib 41 is formed to extend from the tip portion to the engagement hole 33 of corresponding one of the concave portions 24 of the cover upper surface portion 23 on which the base of each rib 41 is located. The surface for guiding the corresponding one of the engagement members 32 is constituted by the arc-shaped tip portion of the slope surface of each rib 41 and a portion of the slope surface of each rib 41 that connects with the arc-shaped tip portion, that extends from the tip portion to the base of each rib 41 and that is accompanied by an increase in a width of each rib 41 toward the base of each rib 41.

As a result, the ribs 41 guides the corresponding ones of the engagement members 32 of the container body 10 while keeping the ribs 41 of the guide members 40 of the cover 20 in the concentric state in which the ribs 41 are concentric with the engagement members 32 of the container body 10 from the initial stage of the placement of the cover 20 over the container body 10. The concentric state continues from a time when the placement of the cover 20 over the container body 10 is completed to a time when the engagement nails 31 of the container body 10 are fitted into the corresponding engagement holes 33 of the cover 20. Also, the formation of the ribs 41 each having a slope surface in its outer shape enables an improvement of the ease of removing a product as the cover 20 from a mold in the process of the formation of the cover 20.

Since each of the guide members 40 of the cover 20 includes the two ribs 41, the tip portions of the two ribs 41 of each of the four guide members 40 touch the upper surface of the engagement nail 31 of the corresponding one of the engagement members 32 of the container body 10 when the cover 20 is placed over the container body 10. In this state, the cover 20 is pushed toward the container body 10 with the slope surfaces of the ribs 41 coming into contact with the slope surfaces of the engagement nails 31. As a result, the misalignment between the central axis of the cover 20 and the central axis of the container body 10 is corrected due to the contact between the slope surfaces of the ribs 41 and the engagement nails 31, and thus the cover 20 becomes concentric with the container body 10.

When the cover 20 is further pushed toward the container body 10 while the ribs 41 disposed on the four portions of the cover 20 are coming into contact with the inner-side surfaces of the four corresponding engagement members 32 and the corresponding engagement nails 31, the process of the placement of the cover 20 over the container body 10 proceeds with the cover 20 concentric with the container body 10. When the process of the placement of the cover 20 over the container body 10 is finished, the engagement nails 31 are fitted into the corresponding engagement holes 33 of the cover 20. As a result, the cover 20 is connected with the container body 10 with the cover 20 concentric with the container body 10, thereby sealing the container body 10.

In the present embodiment, when the cover 20 is placed over the container body 10, the cover 20 is kept concentric with the container body 10, thereby enabling the prevention of damage to the wafers W accommodated in the container body 10 due to a collision between the wafers W and the cover side wall portions 21 of the cover 20.

In the present embodiment, the engagement members 32 are higher than the body side wall portions 14 of the container body 10. As a result, when the cover 20 is placed over the container body 10, the ribs 41 of the guide members 40 first touch the engagement nails 31 of the corresponding engagement members 32. The same applies to the case in which the top wafer W accommodated at a height lower than the body side wall portions 14 of the container body 10 is held by the holding members 25 of the cover 20 protruding downward. Accordingly, damage to the wafers W in the accommodation space 13 can be much more securely prevented from the initial stage of the process of the placement of the cover 20 over the container body 10.

Also, the cover 20 is placed over the container body 10 with the cover 20 concentric with the container body 10, thereby enabling the prevention of damage to the wafers W caused by the holding members 25. Additionally, the container body 10 can be kept concentric with the cover 20 also by a structure of the present embodiment in which the holding members 25 are guided so that the state in which the holding members 25 are tilted outward is changed, by the guide grooves 17, into the state in which the holding members 25 are straightened. As a result, the wafer accommodation container 1 can be infallibly sealed without the misalignment between the central axis of the container body 10 and the central axis of the cover 20 even if a user manually places the cover 20 over the container body 10 without using an automation device such as a robot arm.

In the wafer accommodation container 1, the container body 10 and the cover 20 are preferably made of conductive plastic. Examples of such conductive plastic include plastic to which conductive filler is added, plastic on which polymer alloy processing is performed, and the like. Examples of conductive filler include carbon black, carbon graphite, graphite, carbon fiber, metal powders, metal fiber, metal oxide powders, metal-coated inorganic fine powders, organic fine powders, fiber, and the like.

Figure 8:
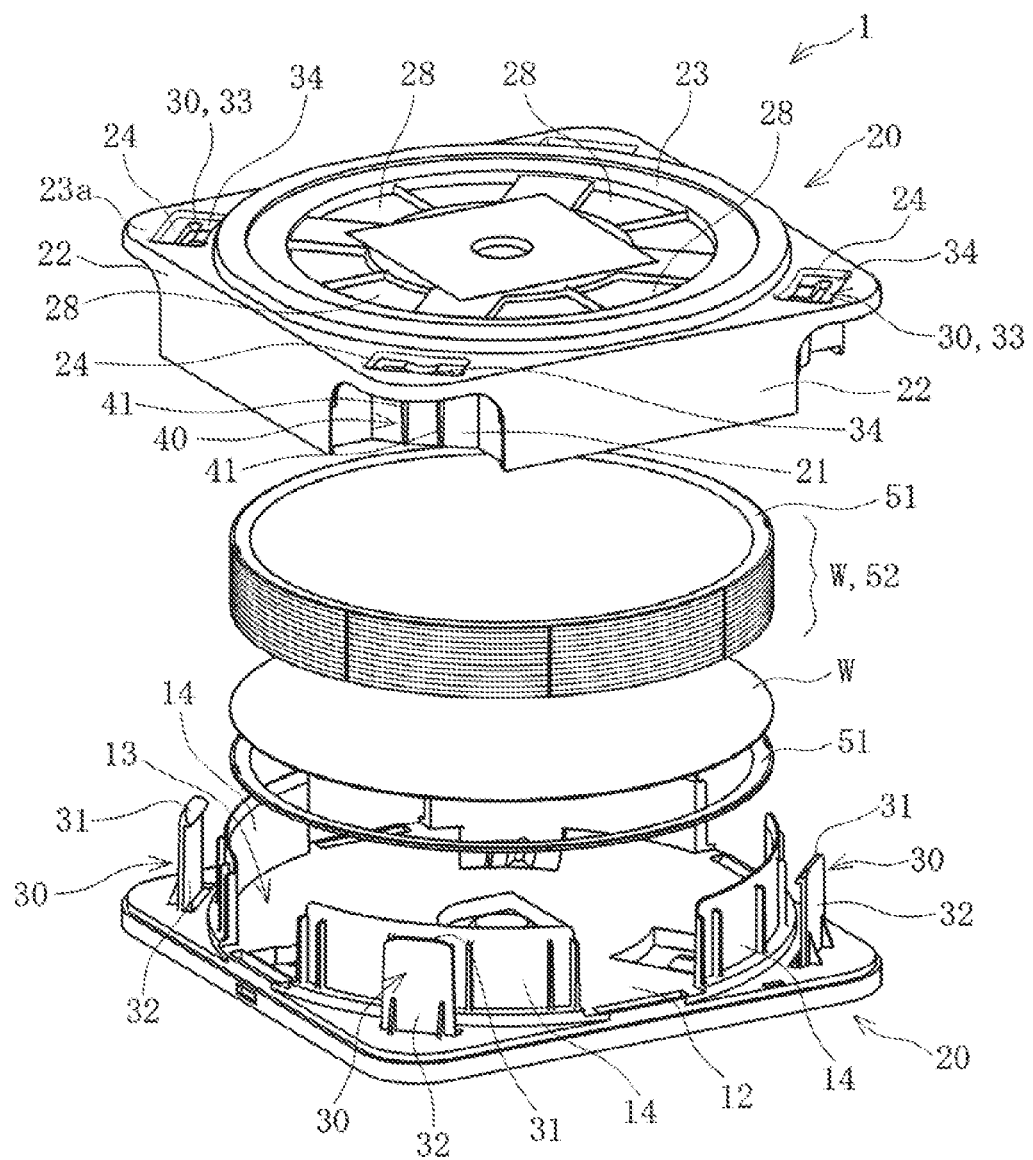
FIG. 8 is an exploded perspective view illustrating the wafer accommodation container according to the embodiment of the present disclosure.

In the wafer accommodation container 1 configured in such a manner, as illustrated in FIG. 8, a ring spacer 51 serving as a bottom-side cushioning element is first placed on the mount element 12 in the accommodation space 13 surrounded by the four body side wall portions 14 of the container body 10. The wafers W and spacer sheets 52 are stacked on the ring spacer 51 alternatingly, and then a ring spacer 51 as a top-side cushioning element is placed on the stack of these wafers W and the spacer sheets 52. The top-side ring spacer 51, the stack of the wafers W and the spacer sheets 52 and the bottom-side ring spacer 51 are accommodated in the accommodation space 13. After the stacked wafers W are accommodated in the container body 10, the cover 20 is placed over the container body 10.

When the cover 20 is placed over the container body 10, as illustrated in FIG. 6A, the tips of the two ribs 41 disposed on each of the four portions (four corners) of the wafer accommodation container 1 touch the upper surface of the engagement nail 31 of the corresponding one of the engagement members 32 of the container body 10. In this state, the cover 20 is pushed toward the container body 10 with the slope surfaces of the ribs 41 coming into contact with the slope surfaces of the engagement nails 31, thereby correcting the misalignment between the central axis of the container body 10 and the central axis of the cover 20 due to the contact between the slope surfaces of the ribs 41 and the slope surfaces of the engagement nails 31 to make the cover 20 concentric with the container body 10.

When the cover 20 is further pushed toward the container body 10 while the ribs 41 disposed on the four portions are coming into contact with the inner-side surfaces of the corresponding engagement members 32 and the corresponding engagement nails 31, the process of the placement of the cover 20 over the container body 10 proceeds with the cover 20 concentric with the container body 10. When the process of the placement of the cover 20 over the container body 10 is finished, the engagement nails 31 are fitted into the corresponding engagement holes 33 of the cover 20. As a result, the cover 20 is connected with the container body 10 with the cover 20 concentric with the container body 10, thereby sealing the container body 10.

Also, when the process of the placement of the cover 20 over the container body 10 proceeds, the edges of the cover outer wall portions 22 of the cover 20 come into contact with the corresponding linear sealing surfaces 16. At this point, the tip portions of the holding members 25 of the cover 20 are located above the corresponding guide grooves 17 of the container body 10.

Also, when the process of the placement of the cover 20 over the container body 10 further proceeds, the tip portions of the holding members 25 are guided by slope portions 17a of the corresponding guide grooves 17 of the cover body 10 to move from the outside to the central side. The holding members 25 swing about the swinging axis portions 26 of their bases.

When the cover 20 is completely placed over the container body 10, as illustrated in FIG. 7A, the holding members 25 come into contact with the center-side vertical portions 17b of the corresponding guide grooves 17. At this point, the holding members 25 are located at the positions at which the inner-side surfaces of the holding members 25 come into contact with the outer circumferential surfaces of the wafers W. As a result, the outer circumferential surfaces of the stacked wafers W are pressed by the pressing face members 27 of the four holding members 25, thereby preventing the horizontal movement of the wafers W.

In such a wafer accommodation container 1, even if the cover 20 is placed over the container body 10 with the wafers W accommodated in the container body 10, the cover 20 becomes concentric with the container body 10 without misalignment between the central axis of the container body 10 and the central axis of the cover 20, thereby preventing damage to the wafers W due to collision between the the wafers W and the cover side wall portions 21 or the holding members 25 of the cover 20.

Additionally, the upper surfaces of the mount element 12 of the container body 10 and the upper pressing portions 28 of the cover upper surface portion 23 of the cover 20 press the stacked substrates W, thereby also preventing the vertical movements of the substrates W.

Additionally, in this state in which the container body 10 is completely covered with the cover 20, the cover side wall portions 21 and the cover outer wall portions 22 of the cover 20 come into contact with the arc-shaped sealing surface 15 and the linear sealing surface 16 of the container body 10, thereby sealing the wafer accommodation container 1.

After the cover 20 is placed over the container body 10, the wafers W accommodated in the accommodation space 13 are horizontally and vertically fixed. Accordingly, even though the wafer accommodation container 1 is transported in any direction, the wafers W do not move any more, thereby preventing rubs with the spacer sheets directly coming into contact with the wafers W, the breakage of the wafers W such as scratch or crack, dust generation, and chemical damage of the wafers W by a chemical substance.

The wafer accommodation container 1 according to the present disclosure includes: a container body 10 having one end that is provided with an opening 11 and another end that is provided with the mount element 12 on which wafers W are stacked, the mount element 12 facing the opening 11; the cover 20 to cover the opening 11; and the connection mechanism 30 to detachably connect the container body 10 and the cover 20. The connection mechanism 30 includes (i) the at least two engagement members 32 each extending from the other end of the container body 10 to the one end of the container body 10 and each having one end that is provided with the engagement nail 31 and (ii) the at least two engagement holes 33 included in the cover 20 and configured to be each fitted to the corresponding engagement nail 31. Also, the cover 20 includes guide members 40 each disposed on corresponding one of cover side wall portions 21 of the cover 20 and configured to guide the cover 20 while the guide members 40 are coming into contact with the corresponding engagement members 32 with the container body 10 kept concentric with the cover 20 when the cover 20 is attached to the container body 10. Such a structure of the wafer accommodation container 1 enables the cover 20 to be guided with the cover 20 concentric with the container body 10 while the guide members 40 disposed on the at least two cover side wall portions 21 are coming into contact with the corresponding engagement members 32 of the container body 10 when the cover 20 is placed over the container body 10. Accordingly, the cover 20 can be placed over the container body 10 without damaging the wafers W accommodated in the container body 10 by the cover side wall portions 21.

In the wafer accommodation container 1 of the present disclosure, the container body 10 includes the body side wall portions 14 defining the accommodation space 13 in which the wafers W stacked on the mount element 12 are accommodated, the body side wall portions 14 are arranged at intervals of L, and the engagement members 32 are formed to be higher than the body side wall portions 14. As a result, when the cover 20 is placed over the container body 10, the guide members 40 first touch the corresponding engagement members 32 higher than the body side wall portions 14 to guide the engagement members 32. As a result, the cover 20 can be infallibly placed over the container body 10 without damaging the wafers W accommodated in the container body 10 by the cover side wall portions 21.

In the wafer accommodation container 1 of the present disclosure, each of the guide members 40 includes the ribs 41 located outside the corresponding one of the cover side wall portions 21. The guide members 40 can be obtained only by providing the cover 20 with the ribs 41. As a result, the structure of the cover 20 can be simplified, a sufficient space for making the cover 20 concentric with the container body 10 can be easily obtained, and the cover side wall portions 21 can be also reinforced.

In the wafer accommodation container 1 according to the present disclosure, the cover 20 includes the cover upper surface portion 23 to close the opening 11, and the cover upper surface portion 23 includes the at least two holding members 25 configured to swing in the central direction and to hold the exterior portions of the stacked wafers W that are accommodated in the container body 10. The pressing surface members 27 to press the outer circumferential surfaces of the wafers W are provided with the holding members 25. The container body 10 has the guide grooves 17 to make the tips of the holding members 25 move from the outer side of the mount element 12 to the inner side of the mount element 12 to guide the tips of the holding members 25 to positions at which the holding members 25 hold the outer circumferential surfaces of the wafers W. The guide grooves 17 are formed as a dent on the surface of the mount element 12. Accordingly, the holding members 25 hold the wafers W accommodated in the container body 1 from the both sides of the wafers W, thereby enabling prevention of the movements of the wafers W.

Also, the tips of the holding members 25 are guided by the guide grooves 17 formed as a dent on the mount element 12 so that the pressing face members 27 press the outer circumferential surfaces of the wafers W. As a result, the outer circumferential surfaces of all of the wafers W stacked on the mount element 12 can be held. Accordingly, even thin wafers W can be infallibly held, thereby enabling the prevention of the movement of the thin wafers W. Additionally, concentrated loads imposed on the wafers W can be avoided by holding the wafers W with surface-to-surface contact, thereby preventing damage to the wafers W.

In the above-described embodiment, the number of the holding members 25 is four. Alternatively, at least two holding members 25 may be formed diagonally on the cover 20. Additionally, three or more holding members 25 may be formed on the cover 20, thereby making it possible to securely hold the wafers W.

Also, one flat plate-shaped holding member 25 is formed at one portion of the cover 20. Alternatively, one flat plate-shaped holding member 25 formed at one portion of the cover 20 may be divided into flat plate-shaped holding portions that can swing perpendicularly to the center of the cover 20. As a result, the wafers W can be securely held by the flat-shaped holding portions obtained by dividing each of the flat plate-shaped holding members 25.

In the above-described embodiment, each of the guide members 40 includes the two ribs 41 located outside the corresponding one of the cover side wall portions 21. Alternatively, each of the guide members 40 may include a single rib 41 having a width wider than the ribs 41 used for the above-described embodiment.

Alternatively, each of the guide members 40 may be formed as a portion of the corresponding cover side wall portion 21 that protrudes outward and that has a U-shaped cross section, and such a portion of the cover side wall portion 21 is obtained by removing a portion of the cover side wall portion 21 between the ribs 41 from the cover side wall portion 21 and connecting the tip portions of the two ribs 41 by a wall member. Any guide members 40 enabling the cover 20 to be placed over the container body 10 with the guide members 40 coming into contact with the engagement members 32 and with the cover 20 concentric with the container body 10 may be used in the present disclosure.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2017-69918, filed on Mar. 31, 2017, the entire disclosure of which is incorporated by reference herein.

INDUSTRIAL APPLICABILITY

The wafer accommodation container according to the present disclosure can be preferably used as, for example, a wafer accommodation container for accommodating semiconductor wafers.

REFERENCE SIGNS LIST

1 Wafer accommodation container
10 Container body
11 Opening
12 Mount element
13 Accommodation space
14 Body side wall portion
15 Arc-shaped sealing surface
16 Linear sealing surface
17 Gide groove
17a Slope portion
17b Vertical portion
20 Cover
21 Cover side wall portion
22 Cover outer wall portion
23, 23a Cover upper surface portion
24 Concave portion
25 Holding member
26 Swinging axis portion
27 Pressing face member
28 Upper pressing portion
30 Connection mechanism
31 Engagement nail
32 Engagement member
33 Engagement hole
34 Engagement face
40 Guide member
41 Rib
51 Ring spacer
52 Spacer sheet
L Interval space
W Wafer

The invention claimed is:

1. A wafer accommodation container comprising:
a container body having (i) one end that is provided with an opening and (ii) another end that is provided with a mount element on which wafers are stacked, the mount element facing the opening;
a cover to cover the opening; and
a connection mechanism to detachably connect the container body and the cover,
wherein the connection mechanism includes (i) at least two engagement members each extending from the another end of the container body to the one end of the container body and each having one end that is provided with an engagement nail and (ii) at least two engagement holes included in the cover and each configured to be each fitted to the corresponding engagement nail,
wherein the cover includes at least two guide members each disposed on corresponding one of cover side wall portions of the cover and configured to guide the cover,
wherein, the at least two guide members each include a tapered slope surface facing outward in a radial direction of the cover, and the at least two engagement members each include a slope surface facing the tapered slope surface of a corresponding guide member of the at least two guide members,
wherein the slope surface of the engagement member of the at least two engagement members and the tapered slope surface of the corresponding guide member of the at least two guide members come into contact with each other while the at least two guide members are coming into contact with the corresponding at least two engagement members with the container body kept concentric with the cover while attaching the cover to the container body, and
wherein when attachment of the cover to the container body is complete, the engagement nail of the engagement member of the at least two engagement members is fitted into a corresponding engagement hole of the at least two engagement holes and rests on top of the corresponding guide member of the at least two guide members.

2. The wafer accommodation container according to claim 1, wherein
the container body comprises body side wall portions defining an accommodation space in which the wafers are accommodated, the body side wall portions being spaced on the mount element, and the engagement members are higher than the body side wall portions.

3. The wafer accommodation container according to claim 2, wherein each of the guide members includes a rib disposed outside the corresponding one of the cover side wall portions.

4. The wafer accommodation container according to claim 2, wherein
the cover comprises a cover upper surface portion to close the opening,
the cover upper surface portion comprises at least two holding members configured to swing in a central direction of the cover upper surface portion and to hold external portions of the wafers stacked and accommodated in the container body,
each of the at least two holding members comprises a pressing face member to press outer circumferential surfaces of the wafers,
the container body has guide grooves to make tips of the corresponding at least two holding members move from an outside of the mount element to an inner of the mount element body to guide the tips of the at least two holding members to positions at which the at least two holding members hold the outer circumferential surfaces of the wafers, and
the guide grooves are formed as a dent on a surface of the mount element.

5. The wafer accommodation container according to claim 1, wherein each of the guide members includes a rib disposed outside the corresponding one of the cover side wall portions.

6. The wafer accommodation container according to claim 5, wherein
the cover comprises a cover upper surface portion to close the opening,
the cover upper surface portion comprises at least two holding members configured to swing in a central direction of the cover upper surface portion and to hold external portions of the wafers stacked and accommodated in the container body,
each of the at least two holding members comprises a pressing face member to press outer circumferential surfaces of the wafers,
the container body has guide grooves to make tips of the corresponding at least two holding members move from an outside of the mount element to an inner of the mount element to guide the tips of the at least two holding members to positions at which the at least two holding members hold the outer circumferential surfaces of the wafers, and
the guide grooves are formed as a dent on a surface of the mount element.

7. The wafer accommodation container according to claim 1, wherein
the cover comprises a cover upper surface portion to close the opening,
the cover upper surface portion comprises at least two holding members configured to swing in a central direction of the cover upper surface portion and to hold external portions of the wafers stacked and accommodated in the container body,
each of the at least two holding members comprises a pressing face member to press outer circumferential surfaces of the wafers,
the container body has guide grooves to make tips of the corresponding at least two holding members move from an outside of the mount element to an inner of the mount element to guide the tips of the at least two holding members to positions at which the at least two holding members hold the outer circumferential surfaces of the wafers, and
the guide grooves are formed as a dent on a surface of the mount element.

* * * * *